(12) United States Patent
Seng et al.

(10) Patent No.: US 6,652,799 B2
(45) Date of Patent: Nov. 25, 2003

(54) METHOD FOR MOLDING SEMICONDUCTOR COMPONENTS

(75) Inventors: Toh Kok Seng, Singapore (SG); Liang C. Tay, Singapore (SG); Kay Kit-Tan, Singapore (SG)

(73) Assignee: Micron Technology, Inc., Boise, ID (US)

( * ) Notice: Subject to any disclaimer, the term of this patent is extended or adjusted under 35 U.S.C. 154(b) by 82 days.

(21) Appl. No.: 10/032,129

(22) Filed: Dec. 31, 2001

(65) Prior Publication Data

US 2002/0056942 A1 May 16, 2002

Related U.S. Application Data

(62) Division of application No. 09/638,948, filed on Aug. 16, 2000, now Pat. No. 6,439,869.

(51) Int. Cl.⁷ .................. B29C 45/14; B29C 45/02; B29C 70/70
(52) U.S. Cl. ............. 264/511; 264/272.15; 264/272.17; 264/328.4; 425/89; 425/116
(58) Field of Search .................. 264/272.17, 510, 264/511, 272.15, 266, 316, 328.4; 425/116, 544, 546, 572, 89

(56) References Cited

U.S. PATENT DOCUMENTS

| | | |
|---|---|---|
| 5,082,615 A | 1/1992 | Sakai |
| 5,204,122 A | 4/1993 | Konishi |
| 5,219,608 A | 6/1993 | Aoki et al. |
| 5,297,897 A | 3/1994 | Venrooij et al. |
| 5,480,296 A | 1/1996 | Jang |
| 5,501,587 A | 3/1996 | Kwak |
| 5,846,477 A | 12/1998 | Hotta et al. |
| 5,891,384 A | 4/1999 | Miyajima |
| 5,961,912 A | 10/1999 | Huang et al. |
| 6,048,483 A * | 4/2000 | Miyajima ............... 264/272.14 |
| 6,071,457 A * | 6/2000 | Bednarz et al. ........ 264/272.17 |
| 6,080,354 A * | 6/2000 | Miyajima .................... 264/511 |
| 6,224,360 B1 * | 5/2001 | Miyajima ..................... 425/89 |
| 6,439,869 B1 * | 8/2002 | Seng et al. .................... 425/89 |
| 6,459,159 B1 * | 10/2002 | Miyagawa et al. ......... 257/778 |
| 2001/0003385 A1 | 6/2001 | Hiroshi |

FOREIGN PATENT DOCUMENTS

| | | |
|---|---|---|
| JP | 6-45380 A | 2/1994 |
| JP | 9-201846 | 9/1997 |
| JP | 11-034066 | 9/1999 |
| JP | 11-34066 | 11/1999 |

* cited by examiner

Primary Examiner—Angela Ortiz
(74) Attorney, Agent, or Firm—Stephen A. Gratton

(57) ABSTRACT

A molding apparatus for molding semiconductor components includes a pair of opposing mold chases having mating mold cavities. The mold cavities are configured to retain polymer release films for separating the molded components from the mold cavities. The molding apparatus also includes a movable pot having a reservoir for retaining a preform of molding compound, and a plunger for moving the molding compound into the mold cavities. The movable pot is mounted for axial movement within a chamfered opening in one of the mold chases. The movable pot is configured to clamp onto the release films to prevent wrinkling of the release films, and seepage of the molding compound under the release films. A system for molding semiconductor components includes the molding apparatus, a pot drive mechanism for moving the movable pot, a plunger drive mechanism for moving the plunger, and a clamping mechanism for clamping the mold chases together. A molding method includes the steps of providing the molding apparatus, placing the release films in the mold cavities, clamping the release films to one of the mold chases, and then injecting the molding compound into the mold cavities.

21 Claims, 6 Drawing Sheets

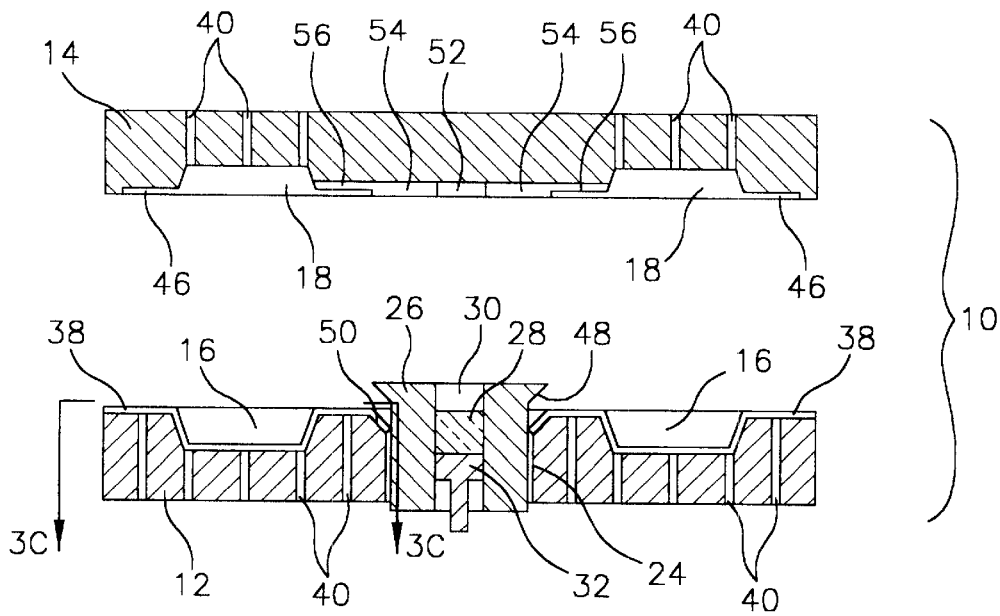
FIGURE 3A
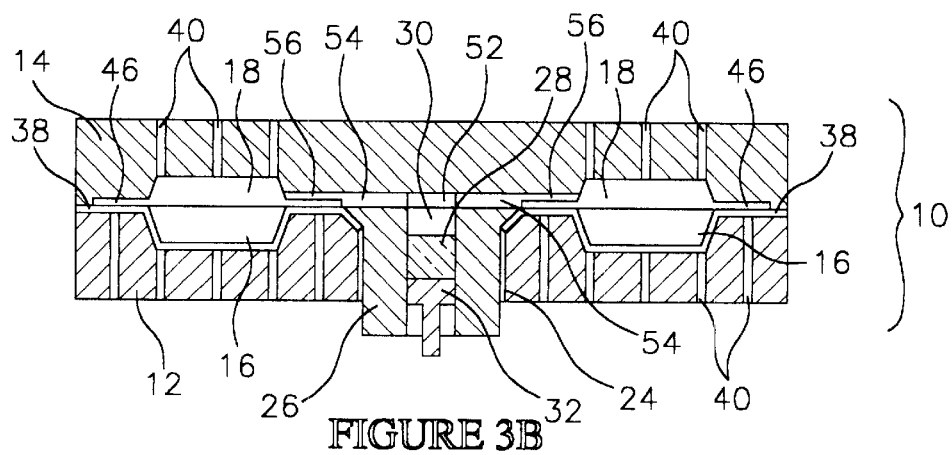
FIGURE 3B
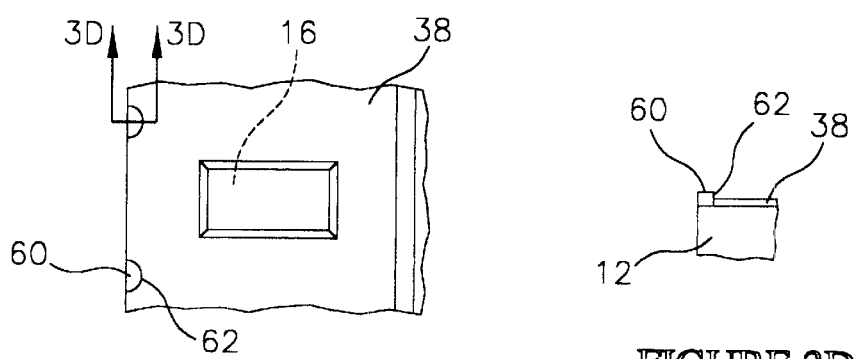
FIGURE 3C
FIGURE 3D

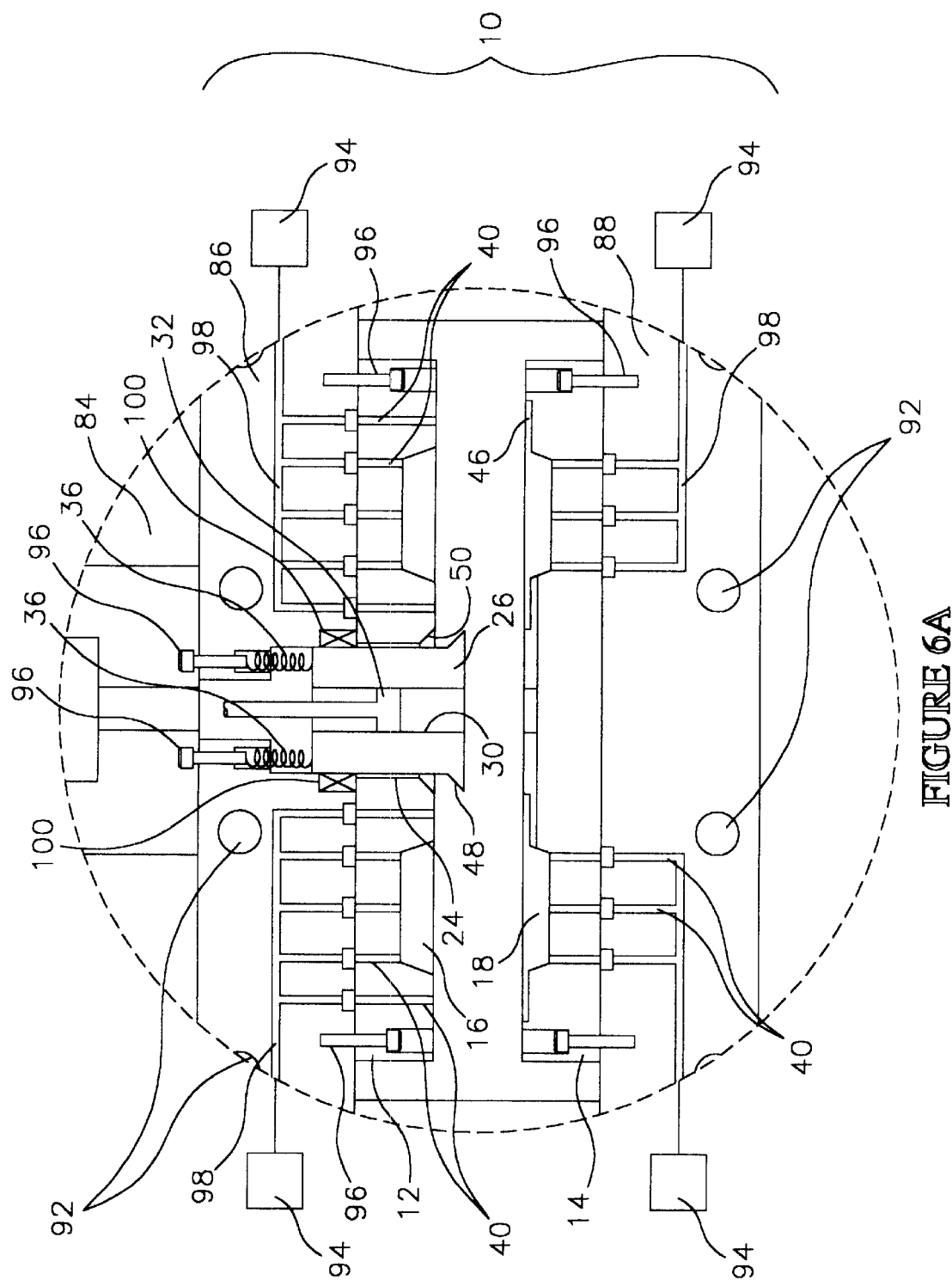

METHOD FOR MOLDING SEMICONDUCTOR COMPONENTS

CROSS REFERENCE TO RELATED APPLICATIONS

This application is a division of Ser. No. 09/638,948, filed Aug. 16, 2000, U.S. Pat. No. 6,439,869 B1.

FIELD OF THE INVENTION

This invention relates generally to semiconductor manufacture, and specifically to an apparatus, to a method, and to a system for molding semiconductor components, such as plastic packages, BGA devices and chip scale packages.

BACKGROUND OF THE INVENTION

Many types of semiconductor components include a molded portion. For example, a conventional plastic semiconductor package includes a semiconductor die encapsulated in a molded plastic body. Typically, the semiconductor package also includes a substrate, such as a metal or organic leadframe, that is attached to the die, and wire bonded to bond pads on the die. During fabrication of the package, a transfer molding process can be used to mold the package body to the substrate to encapsulate the die and wire bonds. Transfer molding processes are also used to form molded portions of other types of semiconductor components, such as BGA devices and chip scale packages.

For performing a transfer molding process, a molding apparatus includes a heated mold cavity, and a pot which holds a preform of molding compound. During the transfer molding process the preform is transferred from the pot into the mold cavity. The mold cavity determines the size, shape and surface finish of the molded portion of the component. Runners and gates in flow communication with the pot and the mold cavity provide a conduit for transferring the molding compound from the pot to the mold cavity. In addition, a plunger can be used to compress the preform of molding compound held in the pot, and to generate a pressure for injecting the molding compound through the runners and gates into the mold cavity.

In the past, the surfaces of the mold cavities, gates and runners have been plated to provide non stick, wear-resistant surfaces for removing the molded component, and for removing excess molding compound following the molding process. The plated surfaces also resist wear from the movement of the abrasive molding compound. Typical plating materials include electroplated chrome, and ion implanted titanium nitride.

A recently developed molding technique uses release films on the mold cavities to release the molded components from the mold cavities following the molding process. The release films comprise thin sheets of a polymer material such as polyester, polymethylpentene or polyimide. U.S. Pat. No. 5,846,477 to Hotta et al., assigned to Nitto Denko Corporation of Osaka, Japan, describes such a molding technique.

One problem with the release film technique is that the release film near the pot of the molding apparatus can become wrinkled by the shape and movement of the mold preform and the plunger. The wrinkled release film can pull away from the mold cavity and cause quality problems with the molded component. For example, the wrinkled release film can cause surface deformities and abnormalities in the shape of the molded component. In addition to wrinkling the release film, the molding compound can also flow under the release film, again adversely affecting the quality of the molded component.

In addition to being placed on the surfaces of the mold cavities, the preform of molding compound can also be pre-wrapped in the release film. Such a technique is described in U.S. Pat. No. 5,891,384 to Miyajima, which is assigned to Apic Yamada Corporation of Nagano, Japan.

This pre-wrapping technique has not been utilized extensively in a production environment. Accordingly it is not a mature technology, and there are quality issues associated with its use. In addition, the pre-wrapped preforms are relatively expensive, and the technique can be relatively expensive to perform.

The present invention is directed to a method, apparatus and system for molding semiconductor components in which the preforms do not require pre-wrapping in release films. Also with the present invention, the release films are protected from wrinkling, and the molding compound is prevented from separating the release films from the mold cavities. The quality of the molded semiconductor components is thus improved.

SUMMARY OF THE INVENTION

In accordance with the present invention, a molding apparatus, a method and a system for molding semiconductor components are provided. In an illustrative embodiment, the apparatus, method and system are configured to mold plastic semiconductor packages to lead frames. Alternately, the apparatus, method and system can be configured to mold other semiconductor components, such as BGA devices and chip scale packages to other types of substrates.

The molding apparatus includes a first mold chase, and an opposing second mold chase. The first mold chase includes a plurality of mold cavities configured to receive release films, and a plurality of air pressure openings in flow communication with the mold cavities. The second mold chase includes a plurality of mold cavities configured for mating engagement with the mold cavities on the first mold chase. In addition, the second mold chase includes runners and gates in flow communication with the mold cavities. The mold chases are movable between an open position, in which the mold cavities are spaced apart, and a closed position in which the mold cavities are clamped together.

The first mold chase also includes a movable pot, and a movable plunger configured to inject a preform of molding compound from the pot, through the runners and the gates, and into the mold cavities. The movable pot is mounted for reciprocal movement in a rectangular opening in the first mold chase that includes chamfered surfaces along opposing edges thereof.

In the open position of the molding apparatus, the movable pot is spaced from the chamfered surfaces, such that the release films can be placed into the mold cavities, and overlapped onto the chamfered surfaces. The release films can comprise generally rectangular sheets of a polymer material such as polyester, polymethlpentene, polyimide or polytetrafluoroethylene. Each release film can be configured to cover multiple cavities corresponding to multiple die mounting sites on a lead frame.

In the closed position of the molding apparatus, the second mold chase moves the movable pot such that a clamping surface on the pot clamps the release films to the chamfered surfaces on the first mold chase. This arrangement prevents the release films from being wrinkled by the plunger as it moves through the pot. In addition, the release films seal against the chamfered surfaces, such that molding compound cannot seep between the release films and the surfaces of the mold cavities.

To perform the method of the invention, the molding apparatus is provided with the first mold chase, and the second mold chase as described above. With the molding apparatus open, the release films are placed over the mold cavities, and on the chamfered surfaces of the opening in the first mold chase. In addition, the lead frames are placed between the mold chases, such that each die on the lead frames aligns with mating mold cavities on the mold chases. Also with the apparatus open, a vacuum directed through the air pressure openings retains the release films in the mold cavities.

The molding apparatus is then closed, such that the mold chases contact one another, and the movable pot clamps the release films to the chamfered surfaces. In the closed position, actuation of the plunger forces the preform of molding compound through the runners and gates, and into the mold cavities. The molding apparatus can then be opened and the molded components ejected from the mold cavities and separated from the release films. Positive air pressure directed through the air pressure openings can be used to facilitate release of the molded components from the mold cavities.

The system includes the molding apparatus mounted to a transfer molding press. The system also includes a plunger drive mechanism for moving the plunger through the movable pot, and a pot drive mechanism for moving the movable pot in the chamfered opening. In an illustrative embodiment the pot drive mechanism comprises a plurality of springs for biasing the movable pot into the open position. Alternately the pot drive mechanism can comprise a hydraulic cylinder, or a camming mechanism operably associated with the movable pot. The system also includes a clamping mechanism for clamping the first mold chase and the second mold chase together in the closed position, and sources of vacuum and pressurized air in flow communication with the air pressure openings.

BRIEF DESCRIPTION OF THE DRAWINGS

FIG. 3A is a schematic cross sectional view of the mold chases and movable pot in an open position;

FIG. 3B is a schematic cross sectional view of the mold chases and movable pot in a closed position;

FIG. 3C is a plan view taken along section line 3C—3C of FIG. 3A illustrating a release film on the first mold chase;

FIG. 3D is a cross sectional view taken along section line 3D—3D of FIG. 3C illustrating alignment pins for the release film;

FIG. 6A is an enlarged cross sectional view taken along section line 6A of FIG. 6 illustrating the mold chases and movable pot of the system.

DETAILED DESCRIPTION OF THE PREFERRED EMBODIMENTS

Figure 1A:
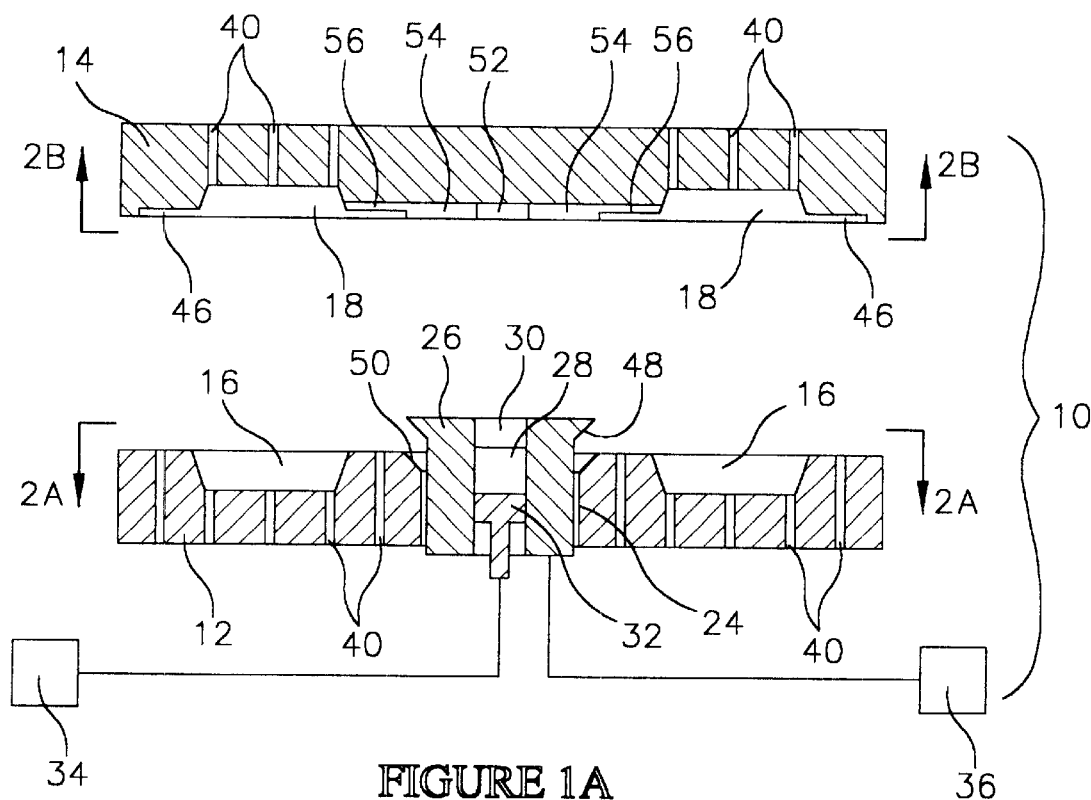
FIG. 1A is a cross sectional view of a molding apparatus constructed in accordance with the invention shown in an open position.
Figure 1B:
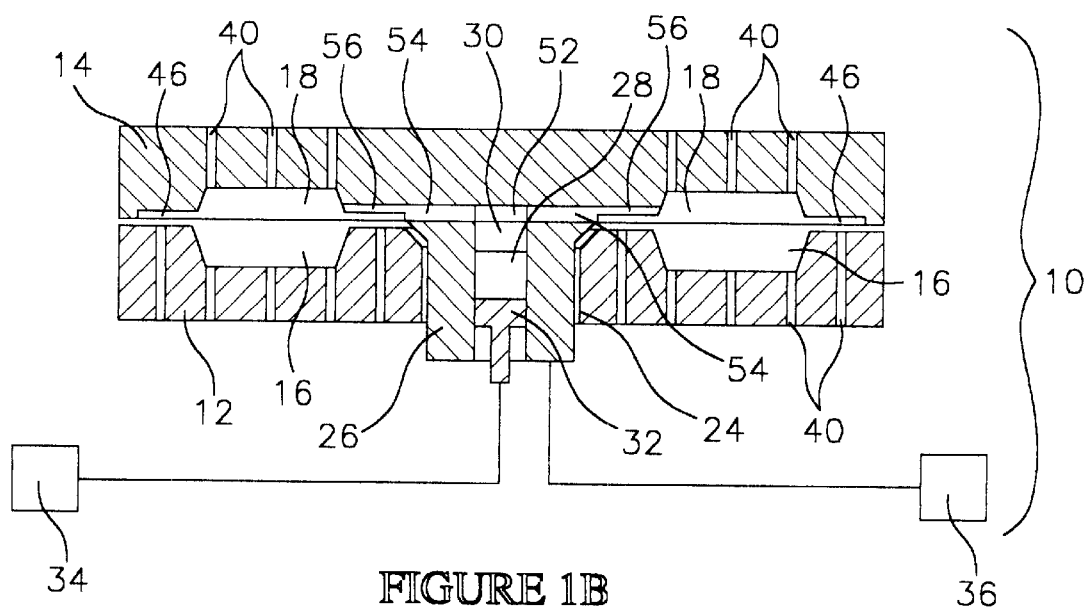
FIG. 1B is a cross sectional view of the molding apparatus constructed shown in a closed position.

Referring to FIGS. 1A and 1B, a molding apparatus 10 constructed in accordance with the invention is illustrated. In FIG. 1A, the molding apparatus 10 is illustrated in an "open position". In FIG. 1B, the molding apparatus 10 is illustrated in a "closed position".

The molding apparatus 10 includes a first mold chase 12 and a second mold chase 14. Either the first mold chase 12, or the second mold chase 14 is movable, such that the mold chases 12, 14 can be moved together into the closed position, or moved apart into the open position.

Figure 4A:
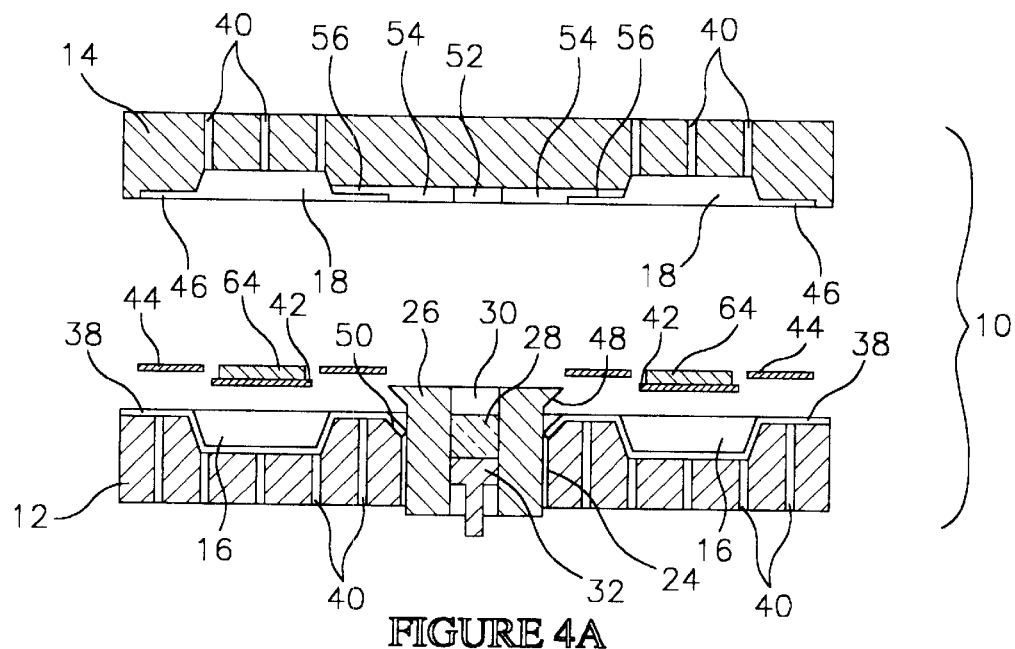
FIGS. 4A–4D are schematic cross sectional views illustrating steps in the method of the invention.

The first mold chase 12 includes a plurality of mold cavities 16, and the second mold chase 14 includes a plurality of mold cavities 18. The mold cavities 16, 18 have mating configurations that define the size and shape of a molded portion 20 (FIG. 4D) of a semiconductor component 22 (FIG. 4D).

In the illustrative embodiment, the semiconductor component 22 (FIG. 4D) comprises a plastic semiconductor package, and the molded portion 20 (FIG. 4D) comprises a plastic body of the package. Alternately, other semiconductor components can include molded portions formed using the molding apparatus 10. Also in the illustrative embodiment, the molded portion 20 is formed by mating mold cavities 16, 18 on the opposing mold chases 12, 14. However, it is to be understood that the invention can also be practiced using mold chases that do not have mating cavities. Such an arrangement can be used to form a molded portion on only one side of a semiconductor component, or to form an asymmetrical component.

Figure 2A:
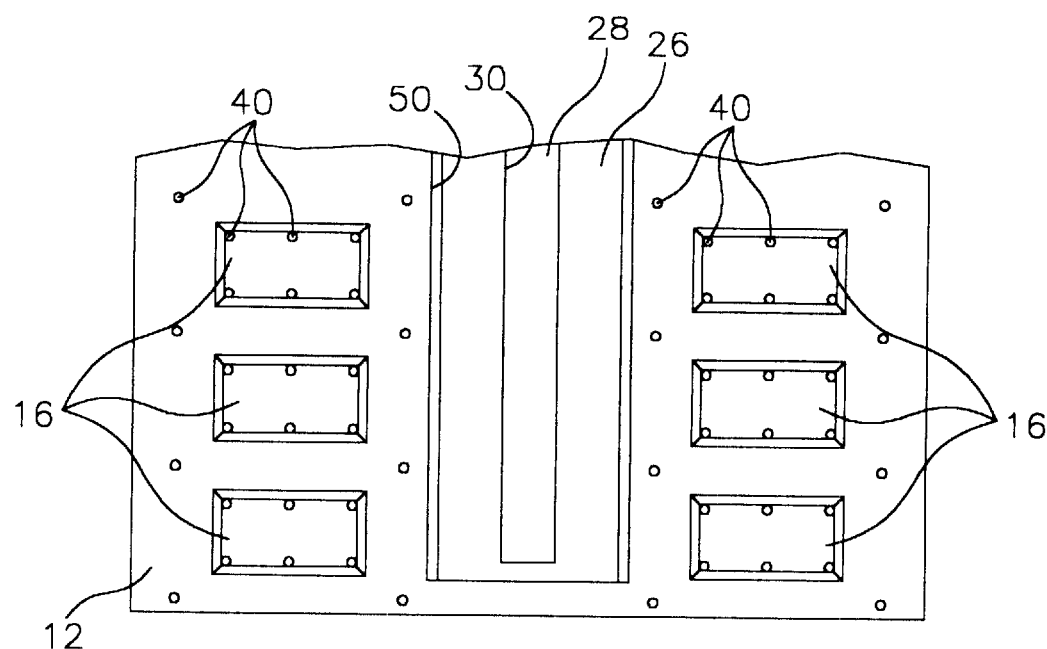
FIG. 2A is a plan view taken along section line 2A—2A of FIG. 1A illustrating a first mold chase of the molding apparatus.

In addition to the mold cavities 16, the first mold chase 12 includes a chamfered opening 24, and a movable pot 26 mounted within the chamfered opening 24. As with the mold chases 12, 14, the movable pot 26 can be positioned in an "open position" as shown in FIG. 1A, or in a "closed position" as shown in FIG. 1B. As shown in FIG. 2A, the movable pot 26 and the chamfered opening 24 are generally rectangular in shape and extend substantially across the length of the first mold chase 12.

The movable pot 26 includes a reservoir 30 configured to contain a preform 28 of molding compound. The movable pot 26 also includes a plunger 32 mounted for reciprocal axial movement within the reservoir 30. The plunger 32 is configured to press against the preform 28 of molding compound to generate hydraulic pressure for moving viscous molding compound from the reservoir 30 into the mold cavities 16, 18. The plunger 32 is operably associated with a plunger drive mechanism 34 configured to move the plunger 32 in axial directions through the reservoir 30. As will be further explained the plunger drive mechanism can comprise a hydraulic cylinder.

The movable pot 26 is operably associated with a pot drive mechanism 36. As will be further explained, the pot drive mechanism 36 can comprise springs, cams or hydraulic cylinders. In the open position of the apparatus 10 (FIG. 1A), the pot drive mechanism 36 moves the movable pot 26 to its open position. As also will be further explained, in the open position of the movable pot 26, release films 38 (FIG. 3A) can be placed into the mold cavities 16 and into the chamfered opening 24 on the first mold chase 12. As shown in FIG. 1B, moving the mold chases 12, 14 to a closed position also moves the movable pot 26 to its closed position such that the release films 38 (FIG. 3B) are clamped against the chamfered opening 24.

The movable pot 26 also includes an enlarged clamping surface 48 configured for mating engagement with a chamfered surface 50 on the chamfered opening 24. The clamping surface 48 is configured to clamp the release films 38 against the chamfered surface 50. In the illustrative embodiment, the clamping surfaces 48 and the chamfered surface 50 have mating 45° angles. However, this angle is merely exemplary and other angles can be employed.

The first mold chase 12, and the second mold chase 14 also include a plurality of air pressure openings 40. Some air pressure openings 40 are located within the mold cavities 16, 18. Others air pressure openings 40 are located proximate to the peripheral edges of the mold cavities 16 to facilitate retention of the release films 38 (FIG. 3A). The air pressure openings 40 can be placed in flow communication with a vacuum source, such that vacuum forces can be generated for holding the release films 38 (FIG. 4A) on the first mold chase 12, and for pulling the release films 38 (FIG. 4A) into the mold cavities 16 on the first mold chase 12. The air pressure openings 40 can also be placed in flow communication with an air pressure source, such that air pressure can be generated for ejecting the semiconductor components 22 (FIG. 4D) from the mold cavities 16, 18 following the molding process. A representative diameter of the air pressure openings 40 can be from about 50 $\mu$m to 200 $\mu$m.

Figure 2B:
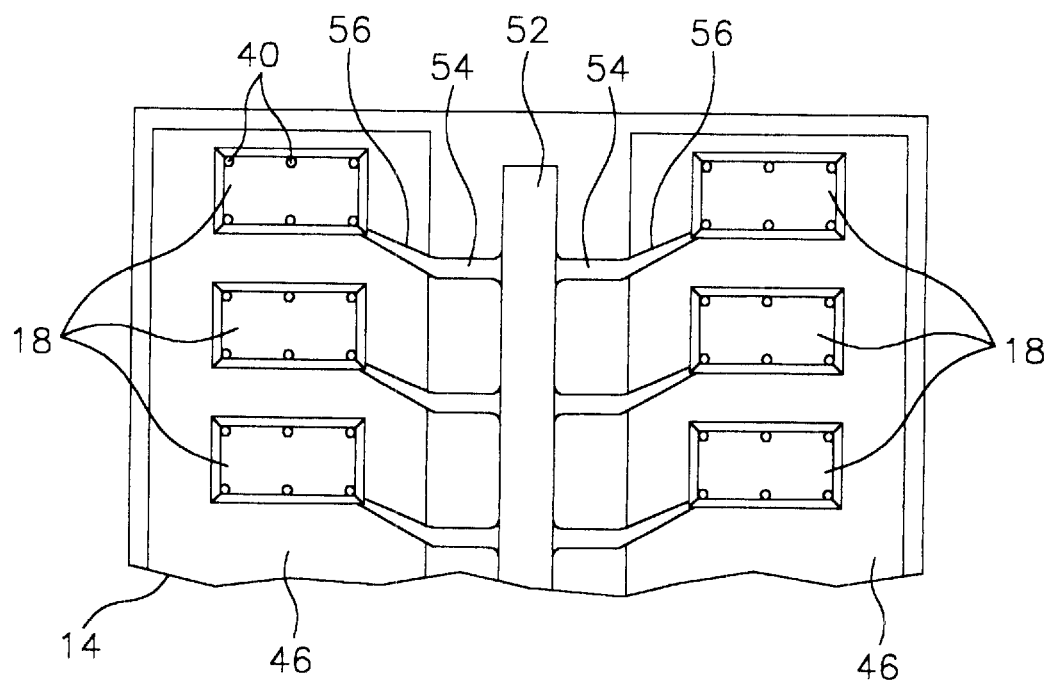
FIG. 2B is a plan view taken along section line 2B—2B of FIG. 1A illustrating a second mold chase of the molding apparatus.

As shown in FIGS. 2A and 2B, the mold cavities 16, 18 are arranged in two rows on either side of the movable pot 26. The size and spacing of the mold cavities 16, 18 corresponds to the size and spacing of die mounting sites 42 (FIG. 4A) of semiconductor leadframes 44 (FIG. 4A). As shown in FIG. 2B, the second mold chase 14 includes recesses 46 on either side of the movable pot 26, that are sized and shaped to retain the leadframes 44 (FIG. 4A).

As shown in FIG. 2B, the second mold chase 14 includes a recess 52 having a peripheral shape corresponding to the peripheral shape of the reservoir 30 in the movable pot 26. The second mold chase 14 also includes runners 54 in flow communication with the recess 52, and gates 56 in flow communication with the mold cavities 18. When the molding apparatus 10 is in a closed position, the plunger 32 can push molding compound into the recess 52, and through the runners 54 and the gates 56, into the mold cavities 16, 18.

Referring to FIGS. 3A–3D, additional features of the molding apparatus 10 are illustrated. In FIG. 3A, the molding apparatus 10, and the movable pot 26, are in the open position. In the open position, the reservoir 30 of the movable pot 26 can be loaded with the preform 28 of molding compound. The preform 28 can comprise a generally rectangular shaped block corresponding in size and shape to the reservoir 30. Alternately the preform 28 can comprise a generally cylindrically shaped block. Suitable materials for the preform 28 include conventional molding compounds such as epoxy resins formulated as B-stage compounds. The preform 28 can also comprise a melamine, polyester, silicone, phenylsilane, or polyimide resin.

Also in the open position of the molding apparatus and movable pot 26, the release films 38 can be placed on the first mold chase 12 on either side of the movable pot 26. The release films 38 can comprise generally rectangular shaped polymer sheets configured to substantially cover multiple molding cavities 16 on the first mold chase 12. For example, the release films can have a length that is about the same as the length of the leadframes 44 (FIG. 4A), and a width that is larger than the width of the leadframes 44 (FIG. 4A).

As shown in FIGS. 3C and 3D, the release films 38 can include notches 62 configured for mating engagement with alignment pins 60 on the first mold chase 12. The notches 62 and alignment pins 60 are configured to align the release films 38 with respect to the mold cavities 16, and with respect to the chamfered opening 24 in the first mold cavity 12. As also shown in FIG. 3C, the release films 38 can be pulled into the mold cavities 16 by directing a negative air pressure or vacuum in the air pressure openings 40.

Suitable polymer materials for the release films 38 include polyester, polymethlpentene, polyimide, polytetrafluoroethylene, polyvinylidene chloride, and glass cloth impregnated with fluoric resin. The release films 38 can also be coated with a heat resistant releasing agent such as silicone. A representative thickness of the release films 38 can be from about 10 $\mu$m to 100 $\mu$m.

As shown in FIG. 3B, with the molding apparatus 10 and the movable pot 26 in the closed position, the release films 38 are clamped to the chamfered opening 24 in the first mold chase 12. In particular, the clamping surfaces 48 on the movable pot 26 clamps the release films 38 to the chamfered surfaces 50. With the release films 38 clamped by the movable pot 26 there is a reduced probability that the release films 38 will become wrinkled, or creased by the action of the plunger 32 and the moving molding compound.

In addition, the clamped release films 38 seal against the surface of the first mold chase 12 and mold cavities 16 such that the molding compound cannot flow between the release films 38 and surfaces of the first mold chase 12 and mold cavities 16. In the closed position of the molding apparatus 10, the plunger 32 can push the molding compound into the reservoir 30 in the second mold chase 14 and through the runners 54 and gates 56 into the mating mold cavities 16, 18.

In the illustrative embodiment, the release films 38 are placed in the mold cavities 16 in the first mold chase 12. However, it is to be understood that the invention can also be practiced by placing additional release films in the mold cavities 18 in the second mold chase 14.

Referring to FIGS. 4A–4D, steps in a method for molding semiconductor components 22 (FIG. 4D) using the molding apparatus 10 are illustrated. Initially, as shown in FIG. 4A, the molding apparatus 10 and the movable pot 26 are in the open positions. In addition, the leadframes 44 are placed between the first mold chase 12 and the second mold chase 14. Each leadframe 44 includes multiple die mounting sites 42 wherein semiconductor dice 64 are attached one die per site. The dice 64 can also be wire bonded to the leadframes 44 prior to being placed between the mold chases 12, 14.

In the illustrative embodiment, the leadframes 44 comprise a metal and the die mounting sites 42 comprise mounting paddles. However, other types of leadframes such as lead-on-chip leadframes can also be employed. In addition, rather than metal, the leadframes 44 can comprise an organic material such as bismaleimide triazine (BT). The recesses 46 in the second mold chase 14 have thicknesses and peripheral shapes corresponding to the leadframes 44, such that the leadframes 44 can be retained within the recesses 46.

As also shown in FIG. 4A, the plunger 32 of the movable pot 26 is in a retracted position such that the preform 28 of molding compound can be placed within the reservoir 30 of the movable pot 26 in contact with the plunger 32. The release films 38 can also be placed within the mold cavities 16 and within the chamfered opening 24 as previously described. A vacuum directed through the air pressure openings 40 can be used to pull the release films 38 into the mold cavities 16.

Figure 4B:
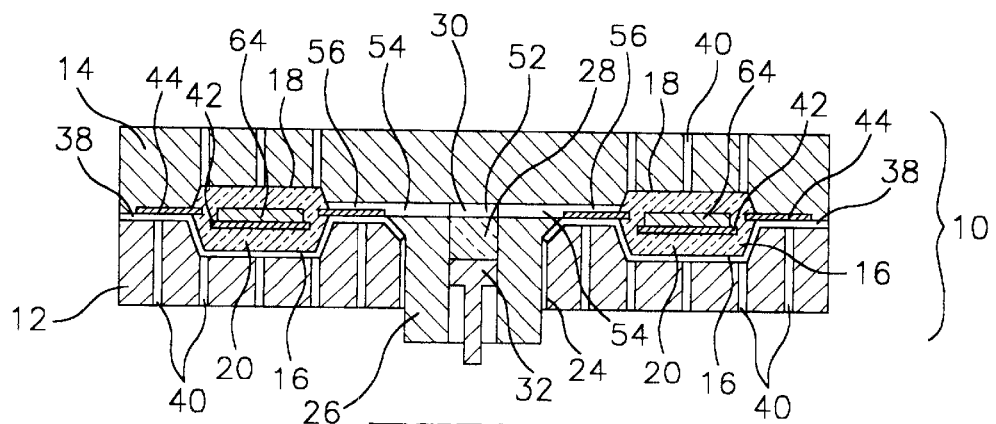

Next, as shown in FIG. 4B, the molding apparatus 10 and movable pot 26 can be placed in the closed positions, such that the mold chases 12, 14 clamp to either side of the leadframes 44 and the movable pot 26 clamps the release films 38 to the chamfered opening 50. In addition, the plunger 32 is extended such that molding compound from the preform 28 is directed into the reservoir 52, and through the runners 54 and gates 56 into the closed mold cavities 16, 18. The mold cavities 16, 18 form the molded portions 20 on the leadframes 44. As the mold compound is moved into the mold cavities 16, 18, the clamping of the release films 38 by the movable pot 26 prevents wrinkling and creasing of the release films 38. The molded portions 20 can thus be formed without surface deformities. In addition, molding compound is not able to flow between the release films 38 and surfaces of the mold cavities 16.

Figure 4C:
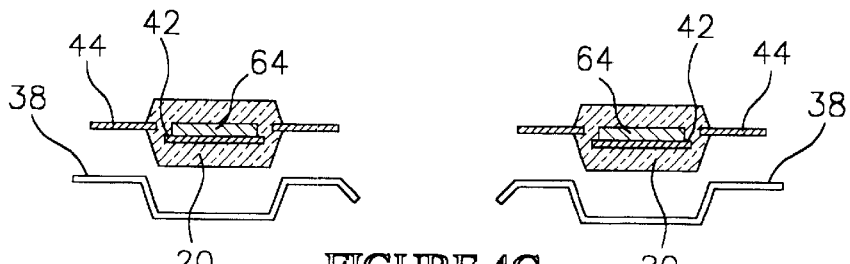
Figure 4D:
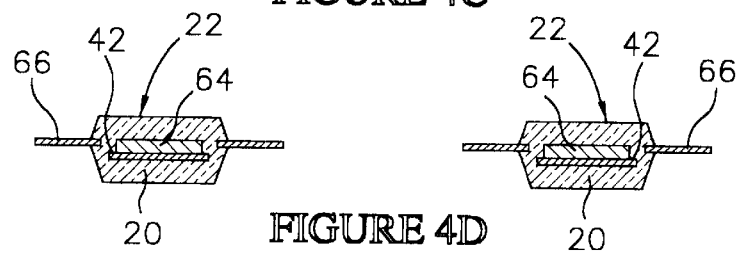

Next, as shown in FIG. 4C, the molding apparatus 10 can be opened and the molded semiconductor components 22 separated from the mold cavities 16, 18. The release films 38 facilitate separation of the molded semiconductor components 22 from the mold cavities 16, 18. In addition, positive air pressure can be directed through the air pressure cavities 40 to facilitate separation of the molded semiconductor components 22 from the mold cavities 16, 18.

As shown in FIG. 4D, the molded semiconductor components 22 include molded portions 20. The molded semiconductor components 22 also include terminal leads 66 formed by cutting the lead frames 44. The components 22 can be fabricated in any conventional configuration for semiconductor packages including TSOP (thin small outline package), DIP (dual in line package), ZIP (zig zag in line package), PLCC (plastic leadless carrier), SOP (small outline package), SOJ (small outline j-bend), PQFP (plastic quad flat package).

Figure 5A:
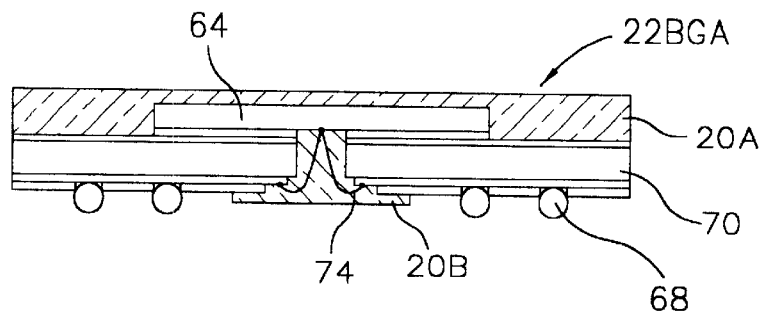
FIG. 5A is a cross sectional view of a BGA device that can be fabricated in accordance with the invention.

Rather than molding plastic packages, the method of the invention can be used to mold other types of semiconductor components. For example, as shown in FIG. 5A, the method can be used to mold a semiconductor component 22BGA such as a BGA device having solder balls 68 in a ball grid array. The component 22BGA includes asymmetrical molded portions 20A, 20B molded to an organic substrate 70. Molded portion 20A encapsulates a semiconductor die 64. Molded portion 20B encapsulates wire bonds 74 to the die 64.

Figure 5B:
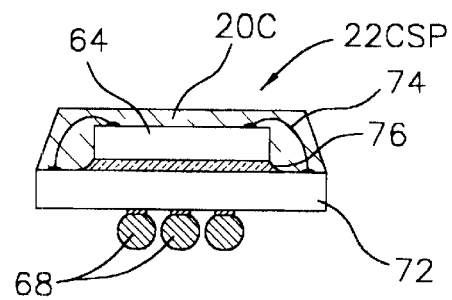
FIG. 5B is a cross sectional view of a chip scale package that can be fabricated in accordance with the invention.

As shown in FIG. 5B, the method can also be used to form a semiconductor component 22CSP, such as a chip scale package. The component 22CSP includes a molded portion 20C that encapsulates a semiconductor die 64 and wire bonds 74 to the die 64. The component 22CSP also includes a substrate 72 such as ceramic or FR-4 with an array of solder balls 68. An adhesive layer 76 attaches the die 64 to the substrate 72. With the semiconductor component 22CSP, the molded portion 20C is formed on only one side of the component 22CSP. Accordingly, the opposing mold chases for forming the molded portion 20C need only include one mold cavity rather than mating mold cavities as in the previous embodiments.

Figure 6:
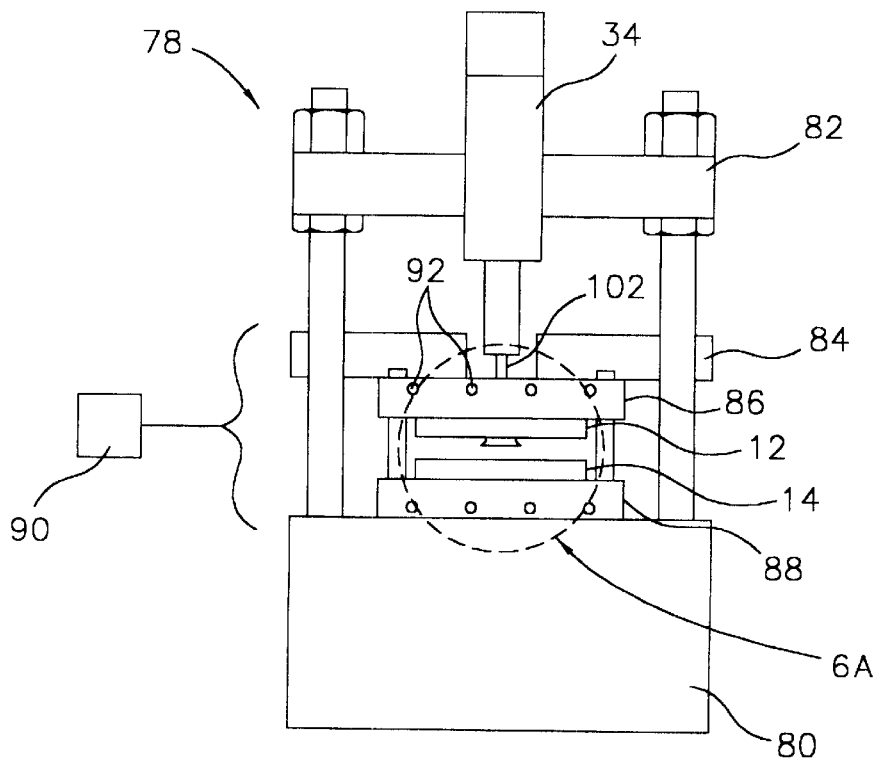
FIG. 6 is a schematic side elevation view of a system constructed in accordance with the invention.

Referring to FIGS. 6 and 6A, a system 78 constructed in accordance with the invention is illustrated. The system 78 includes the molding apparatus 10 (FIG. 6A) as previously described. In addition, the system 78 includes a base 80, a fixed cross head 82 fixedly attached to the base 80, and a movable cross head 84 movable attached to the base 80.

A top platen 86 is attached to the movable cross head 84 and a bottom platen 88 is attached to the base 80. The platens 86, 88 include heaters 92 for heating the mold cavities 16, 18. A clamping mechanism 90 moves the movable cross head 84 and the top platen 86 for placing the molding apparatus 10 in the open position or the closed position as previously described. In addition, the plunger drive mechanism 34 is attached to the fixed cross head 82 and to the plunger 32. In the illustrative embodiment, the plunger drive mechanism 34 comprises a hydraulic cylinder in flow communication with a source of pressurized fluid. In addition, a rod 102 of the cylinder is attached to the plunger 32.

As shown in FIG. 6A, the first mold chase 12 is attached to the top platen 86 using threaded fasteners 96. Air pressure conduits 98 in the top platen 86 are in flow communication with the air pressure openings 40 in the first mold chase 12. The air pressure conduits 98 are also in flow communication with vacuum or pressure sources 94. The vacuum or pressure sources 94 are configured to provide air having either a negative pressure (vacuum) or a positive pressure.

The top platen 86 also includes bearings 100 that support the movable pot 26 for axial movement within the chamfered opening 24 in the first mold chase 12. In addition, the top platen 86 includes the pot drive mechanism 36 for biasing the movable pot 26 into its open position when the molding apparatus 10 is in its open position. In the illustrative embodiment, the pot drive mechanism 36 comprises springs mounted to openings in the top platen 86 and secured with threaded fasteners 96. The movable pot 26 can also include a retention mechanism (not shown) such as clips and associated grooves that prevent the movable pot 26 from coming out of the chamfered opening 24.

Movement of the top platen 86 by the clamping mechanism 90 moves the molding apparatus 10 to its closed position. In addition, the movable pot 26 is moved to its closed position by the second mold chase 14 pressing against the movable pot 26 as the molding apparatus 10 moves to its closed position.

The second mold chase 14 is attached to the bottom platen 88 using threaded fasteners 96. Also, air conduits 98 in the bottom platen 88 are in flow communication with the air pressure openings 40 in the second mold chase 14 and with the vacuum or pressure sources 94.

Thus the invention provides an improved apparatus, method and system for molding semiconductor components. While the invention has been described with reference to certain preferred embodiments, as will be apparent to those skilled in the art, certain changes and modifications can be made without departing from the scope of the invention as defined by the following claims.

What is claimed is:

1. A method for molding a semiconductor component comprising:
   providing a mold chase, a mold cavity in the mold chase, and a pot configured for reciprocal movement on the mold chase and having a clamping surface;
   placing a release film in the mold cavity and between the mold chase and the clamping surface;
   moving the pot to clamp the release film between the clamping surface and the mold chase; and
   injecting a molding compound into the mold cavity.

2. The method of claim 1 wherein the clamping surface comprises an enlarged portion of the pot.

3. The method of claim 1 wherein the mold chase includes an opening wherein the pot is mounted having a chamfered surface proximate to the clamping surface.

4. A method for molding a semiconductor component comprising:

providing a substrate for the component;

providing a molding apparatus comprising an opening having a chamfered surface, a mold cavity configured to form a molded portion of the component on the substrate, and a movable pot in the opening comprising a plunger configured to inject a molding compound into the mold cavity;

placing a release film in the mold cavity;

placing the substrate in the mold cavity;

moving the movable pot to clamp the release film to the chamfered surface; and injecting the molding compound into the mold cavity.

5. A method for molding a semiconductor component comprising:

providing a substrate for the component;

providing a molding apparatus comprising a surface, a mold cavity configured to form a molded portion of the component on the substrate, and a movable pot comprising a plunger configured to inject a molding compound into the mold cavity and an enlarged clamping surface;

placing a release film in the mold cavity;

placing the substrate in the mold cavity;

moving the movable pot to clamp the release film to the surface; and injecting the molding compound into the mold cavity.

6. The method of claim 5 wherein the component comprises an element selected from the group consisting of plastic packages, ball grid array devices, and chip scale packages.

7. A method for molding a semiconductor component comprising:

providing a mold chase comprising a mold cavity;

providing a pot mounted for axial movement on the mold chase, the pot comprising a reservoir configured to retain a molding compound and a clamping surface;

providing a plunger configured to move through the reservoir to inject the molding compound into the mold cavity;

placing a release film on the mold cavity and between the clamping surface and the mold chase;

moving the pot to clamp the release film between the clamping surface and the mold chase; and injecting the molding compound into the mold cavity.

8. The method of claim 7 wherein the mold chase comprises a first mold chase and an opposing second mold chase.

9. The method of claim 7 wherein the mold chase includes a surface configured for clamping the release film.

10. The method of claim 7 wherein the component includes a leadframe placed in the mold cavity prior to the injecting step.

11. The method of claim 7 wherein the component includes an organic substrate placed in the mold cavity prior to the injecting step.

12. The method of claim 7 wherein the clamping surface comprises an enlarged portion of the pot.

13. A method for molding a semiconductor component comprising:

providing a substrate for the component;

providing a mold chase configured to form a molded portion on the substrate, the mold chase comprising a mold cavity, an opening and a surface;

providing a pot mounted for axial movement within the opening from an open position to a closed position, the pot comprising a reservoir configured to retain a molding compound, a plunger configured to inject the molding compound into the mold cavity, and a clamping surface;

with the pot in the open position, placing a release film on the mold cavity and on the surface;

placing the substrate on the mold chase proximate to the mold cavity;

moving the pot to the closed position such that the clamping surface clamps the release film to the surface; and injecting the molding compound into the mold cavity.

14. The method of claim 13 further comprising directing a vacuum into the mold cavity during the placing the release film step.

15. A method for molding a semiconductor component comprising:

providing a substrate for the component;

providing a mold chase configured to form a molded portion on the substrate, the mold chase comprising a mold cavity, an opening and a surface including a chamfered portion of the opening;

providing a pot mounted for axial movement within the opening, the pot comprising a reservoir configured to retain a molding compound, a plunger configured to inject the molding compound into the mold cavity, and a clamping surface;

placing a release film on the mold cavity and on the surface;

placing the substrate on the mold chase proximate to the mold cavity;

moving the pot such that the clamping surface clamps the release film to the surface; and injecting the molding compound into the mold cavity and onto the substrate to form the molded portion.

16. A method for molding a semiconductor component comprising:

providing a substrate for the component;

providing a mold chase configured to form a molded portion on the substrate, the mold chase comprising a mold cavity, an opening and a surface;

providing a pot mounted for axial movement within the opening, the pot comprising a reservoir configured to retain a molding compound, a plunger configured to inject the molding compound into the mold cavity, and a clamping surface comprising an enlarged portion of the pot;

placing a release film on the mold cavity and on the surface;

placing the substrate on the mold chase proximate to the mold cavity;

moving the pot such that the clamping surface clamps the release film to the surface; and injecting the molding compound into the mold cavity and onto the substrate to form the molded portion.

17. A method for molding a semiconductor component comprising:

providing a mold chase comprising a surface and a mold cavity;

providing a movable pot to on the mold chase comprising a reservoir configured to retain a molding compound, a plunger configured to inject the molding compound into the mold cavity, and a clamping surface;

placing the release film in the mold cavity and on the surface;

moving the pot to seal the release film on the surface; and injecting the molding compound into the mold cavity.

18. The method of claim 17 wherein the mold chase includes an opening for the pot and the surface comprises a chamfered portion of the opening.

19. The method of claim 17 wherein the clamping surface comprises an enlarged portion of the pot.

20. The method of claim 17 wherein the pot is in an open position during the placing the release film step and is in a closed position following the moving the pot step.

21. The method of claim 17 further comprising providing the mold chase with an alignment member and aligning the release film to the mold cavity during the placing the release film step using the alignment member.

* * * * *